(12) United States Patent
Silverstein et al.

(10) Patent No.: US 9,119,159 B2
(45) Date of Patent: Aug. 25, 2015

(54) BATTERY POWER MONITORING AND AUDIO SIGNAL ATTENUATION

(75) Inventors: Roy B. Silverstein, San Diego, CA (US); Dinesh Ramakrishnan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 656 days.

(21) Appl. No.: 13/206,372

(22) Filed: Aug. 9, 2011

(65) Prior Publication Data

US 2012/0177226 A1 Jul. 12, 2012

Related U.S. Application Data

(60) Provisional application No. 61/431,409, filed on Jan. 10, 2011.

(51) Int. Cl.
*H04W 52/02* (2009.01)
*H03G 3/00* (2006.01)
*G06F 1/32* (2006.01)

(52) U.S. Cl.
CPC ............ *H04W 52/0267* (2013.01); *G06F 1/325* (2013.01); *G06F 1/3212* (2013.01); *H03G 3/001* (2013.01); *H03G 3/007* (2013.01); *Y02B 60/1292* (2013.01)

(58) Field of Classification Search
CPC .... H04W 52/0267; H03G 7/00; H03G 7/002; H03G 7/007; H03G 3/001; H03G 3/002; H03G 3/32; G06F 1/3212; G06F 1/325; G06F 1/3215; Y02B 60/1292
USPC ............. 381/104, 106, 107, 58, 55, 120, 323; 455/343.5, 574, 234.1, 234.2, 249.1
See application file for complete search history.

(56) References Cited

U.S. PATENT DOCUMENTS 5,255,325 A 10/1993 Ishimitsu et al.
6,108,426 A * 8/2000 Stortz ............................. 381/77
(Continued)

FOREIGN PATENT DOCUMENTS

JP H05102770 A 4/1993
JP 2006311382 A 11/2006
(Continued)

OTHER PUBLICATIONS

International Search Report and Written Opinion—PCT/US2012/020673—ISA/EPO—Apr. 5, 2012.

*Primary Examiner* — Vivian Chin
*Assistant Examiner* — David Ton
(74) *Attorney, Agent, or Firm* — Austin Rapp & Hardman

(57) ABSTRACT

To reduce the risk of brown outs and resets in a mobile station using a far-field speaker, a voltage level of a battery and a level of an input audio signal are monitored. When the level of the audio signal increases past a threshold level, and the voltage level of the battery falls below a threshold voltage, an attenuation is determined and applied to the audio signal. The applied attenuation reduces the volume of the audio signal, which reduces the risk of a brown out or a reset due to insufficient voltage in the mobile station.

46 Claims, 9 Drawing Sheets

(56) References Cited

U.S. PATENT DOCUMENTS

| | | |
|---|---|---|
| 7,110,559 B2 * | 9/2006 | Behboodian et al. ......... 381/106 |
| 7,450,973 B2 | 11/2008 | Choi et al. |
| 2006/0247920 A1 | 11/2006 | Toriyama |
| 2007/0076897 A1 | 4/2007 | Philipp |
| 2007/0140513 A1 * | 6/2007 | Furge ........................ 381/120 |
| 2007/0201703 A1 * | 8/2007 | Dorogusker et al. ........... 381/58 |
| 2008/0057894 A1 | 3/2008 | Aleksic et al. |
| 2008/0307240 A1 | 12/2008 | Dahan et al. |
| 2009/0204831 A1 | 8/2009 | Cousson et al. |
| 2009/0313484 A1 | 12/2009 | Millet et al. |
| 2010/0246857 A1 * | 9/2010 | Kajita ........................ 381/120 |

FOREIGN PATENT DOCUMENTS

| | | |
|---|---|---|
| JP | 2007512733 A | 5/2007 |
| JP | 2009094684 A | 4/2009 |
| JP | 2009141670 A | 6/2009 |
| JP | 2010045481 A | 2/2010 |
| KR | 20060086380 A | 7/2006 |
| WO | 2005048644 A2 | 5/2005 |
| WO | WO2007100707 A2 | 9/2007 |
| WO | WO-2010145683 A1 | 12/2010 |

* cited by examiner

BATTERY POWER MONITORING AND AUDIO SIGNAL ATTENUATION

CROSS-REFERENCE TO RELATED APPLICATIONS

This application claims priority under the benefit of 35 U.S.C. §120 to Provisional Patent Application No. 61/431,409, filed on Jan. 10, 2011. This provisional patent application is hereby expressly incorporated by reference herein in its entirety.

BACKGROUND

Many mobile stations, such as mobile phones, support far-field speakers. These far-field speakers may be used for a variety of applications such as speakerphones and music applications. Typically, the far-field speaker outputs an audio signal from the mobile station at a higher than typical volume so that the mobile station may be placed away from a user's ear. For example, the mobile station may be placed on a table and used as a speaker phone for a group of users sitting at the table.

Mobile stations typically comprise a power source in the form of a rechargeable battery. One problem associated with far-field speakers may occur if the voltage from the battery is not sufficient to support the increased voltage demands of the far-field speaker. Whether the far-field speaker driver is powered directly from the battery or from a voltage booster (e.g. a 5V boost, etc.), the current demands on the battery at high audio output power may cause the battery voltage to brown out. Such a brown out could cause the mobile station to shutdown or reset.

SUMMARY

In order to reduce the risk of brown outs and resets in a mobile station using a far-field speaker, a voltage level of a battery and a level of a digital audio signal are monitored. When the level of the audio signal increases past a threshold level, and the voltage level of the battery falls below a threshold voltage, an attenuation is determined and applied to the digital audio signal. The applied attenuation reduces the volume of the digital audio signal, which reduces the risk of a brown out or a reset due to insufficient voltage in the mobile station.

In an implementation, a method for attenuating input audio signals in a mobile device is provided. A battery voltage level of a battery of the mobile device is determined. An audio signal level of an audio signal is determined, and the audio signal is attenuated based on the battery voltage level and the audio signal level.

In an implementation, an apparatus for attenuating input audio signals in a mobile device is provided. The apparatus includes means for determining a battery voltage level of a battery of the mobile device, means for determining an audio signal level of an input audio signal, and means for attenuating the audio signal based on the battery voltage level and the audio signal level.

In an implementation, a computer-readable medium comprising instructions is provided. The instructions cause a computer to determine a battery voltage level of a battery, determine an audio signal level of an input audio signal, and attenuate the audio signal based on the battery voltage level and the audio signal level.

In an implementation, an apparatus for attenuating input audio signals is provided. The apparatus includes a voltage level determiner for determining a battery voltage level of a battery of the apparatus, and an attenuation determiner for determining an audio signal level of an input audio signal and attenuating the audio signal based on the battery voltage level and the audio signal level.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there are shown in the drawings example constructions of the embodiments; however, the embodiments are not limited to the specific methods and instrumentalities disclosed. In the drawings.

DETAILED DESCRIPTION

Figure 1:
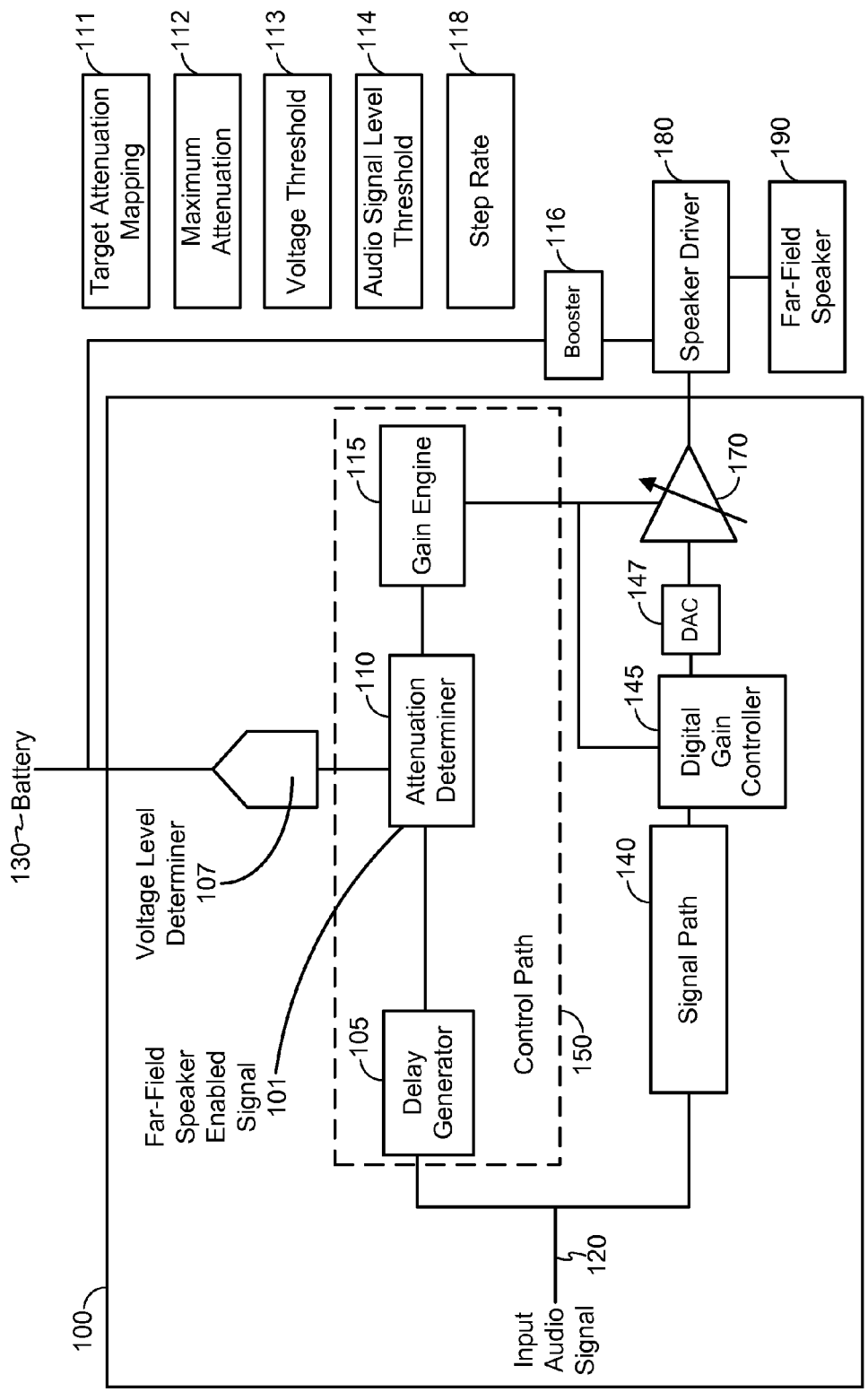
FIG. 1 is an illustration of an environment for determining an amount of attenuation to apply to an input audio signal.

FIG. 1 is an illustration of an environment 100 for determining an amount of attenuation to apply to an input audio signal. The environment 100 may be implemented using a mobile station 800 and/or a computing device 900 described with respect to FIGS. 8 and 9, respectively. The environment 100 includes a control path 150 that includes a delay generator 105, an attenuation determiner 110, and a gain engine 115. The environment 100 further includes a signal path 140, a battery 130, a voltage level determiner 107, an amplifier 170, a DAC (digital-to-analog converter) 147, a digital gain controller 145, a booster 116, a speaker driver 180, and a far-field speaker 190. More or fewer components may be supported.

An input audio signal 120 may be received by the environment 100. The input audio signal 120 may be generated by a processor or other component of the mobile station associated with the environment 100. For example, the input audio signal 120 may be a digital audio signal generated by the mobile station during audio or video playback, or as part of a telephonic conversation.

The input audio signal 120 may pass through what is referred to herein as the signal path 140. The signal path 140 may represent a variety of functional and/or processing components that may act on the input audio signal 120 as part of one or more supported codecs. For example, in some implementations, the components of the signal path 140 may include an up-sampler and a zero order hold. Moreover, while illustrated separately, the signal path 140 may further include the DAC 147 and the digital gain controller 145. More or fewer components may also be included in the signal path 140.

After leaving the signal path 140, the input audio signal 120 may pass through an amplifier 170 (or optionally the digital gain controller 145 and/or the DAC 147) to a speaker driver 180. The speaker driver 180 may provide the processed audio signal as output to a far-field speaker 190. In addition, in order to provide additional volume and/or amplify the signal with less distortion, the amplifier 170 may utilize a voltage boost by the booster 116. For example, the speaker driver 180 may receive its power from an additional 5 V boost instead of directly from the battery.

Whether the voltage boost is used or not, current drawn by the speaker driver 180 may have adverse effects on the mobile station. For example, if the voltage of the battery 130 is low, the mobile station may not have enough available voltage to power other components of the mobile station (i.e., may brown out) or in some cases may reset when the far-field speaker is in use and outputting large signals.

Accordingly, the environment 100 may include the control path 150 to prevent one or more of the adverse effects associated with the usage of the far-field speaker 190. In particular, the control path 150 may determine whether to apply attenuation to the input audio signal 120 (i.e., attenuate the input audio signal 120), and if so, how much attenuation to apply before the input audio signal 120 is provided to the far-field speaker 190. The attenuation may result in a temporary drop in the volume of the input audio signal 120, and therefore reduce the current drawn by the speaker driver 180. The reduced current may prevent the reset and/or brown out conditions described above.

The control path 150 may include a delay generator 105. The delay generator 105 may add an amount of delay to the control path 150 that is equivalent to the overall delay of the signal path 140. As may be appreciated, the delay may be added to the control path 150 so that the determination whether to attenuate the input audio signal 120 may be made proximate to the input audio signal 120 exiting the signal path 140. Thus, the delay generator 105 may sync the input audio signal 120 in the control path 150 with the input audio signal 120 in the signal path 140.

The amount of the delay added to the input audio signal 120 by the delay generator 105 may be dependent on a variety of implementation details, such as the type of codec and interpolation filters used by the signal path 140. In addition, the amount of delay added by the delay generator 105 may also be reduced to account for delay introduced by the other components of the control path 150 such as by the attenuation determiner 110 and the gain engine 115. In some implementations, the total delay may be calculated using equation (1):

Total delay=delay from signal path 140−(delay from attenuation determiner 110+delay from gain engine 115)  (1).

In equation (1), the delay from the signal path 140 may be a measure of the time from when the input audio signal 120 enters the signal path 140 to the time the input audio signal 120 exits the signal path 140 (including the DAC 147 and/or the digital gain controller 145). The delay from the attenuation determiner 110 may be the delay associated with determining whether to apply attenuation to the input audio signal 120. The delay from the gain engine 115 may be the delay associated with applying the attenuation to the input audio signal 120, and may include any delay associated with configuring the amplifier 170.

The attenuation determiner 110 may receive the input audio signal 120 after the delay has been applied from the delay generator 105, and may determine how much, if any, attenuation to apply to the input audio signal 120. In addition, if attenuation is already being applied to the input audio signal 120, the attenuation determiner 110 may determine if the applied attenuation may be adjusted or eliminated.

The attenuation determiner 110 may receive a battery voltage level from the voltage level determiner 107, and may determine whether to attenuate the input audio signal 120 based on the received battery voltage level. In some implementations, the attenuation determiner 110 may determine to attenuate the input audio signal 120 if the battery voltage level is less than a voltage threshold 113. In some implementations, the voltage threshold 113 may be 3.6 volts. However, other voltage thresholds 113 may be supported and/or selected by a user or an administrator, for example.

The attenuation determiner 110 may further determine a level of the input audio signal 120. In some implementations, the attenuation determiner 110 may determine the level of the input audio signal 120 based on one or more peak input audio signal 120 levels. The attenuation determiner 110 may determine peak input audio signal 120 levels for each block of the input audio signal 120. For example, 10 ms blocks may be used. The attenuation determiner 110 may forget previously determined peaks levels from blocks every 20 ms. The attenuation determiner 110 may then use a current maximum peak input audio signal 120 level from one of the blocks as the input audio signal 120 level.

In other implementations, the attenuation determiner 110 may determine the level of the input audio signal 120 based on an average level of the input audio signal 120. The attenuation determiner 110 may determine the average level for each block of the input audio signal level 120. For example, the average may be computed by averaging the absolute levels within a block or it may be computed as root mean squared (RMS) value of the levels within a block. The attenuation determiner 110 may then average the determined levels for one or more of the blocks to smooth out the determined levels. The attenuation determiner 110 may then use a current average level as the input audio signal 120 level.

The voltage level determiner 107 may comprise one or more of a variety of known analog-to-digital voltage converters. The voltage level determiner 107 may quickly determine the battery voltage level so that the attenuation determiner 110 may make the attenuation determination using the current conditions of the battery 130. In some implementations, the voltage level determiner 107 may determine the battery voltage level with 8 bits of accuracy, although other accuracy levels may also be supported.

In some implementations, the voltage level determiner 107 may employ filtering techniques to smooth the determined battery voltage levels. For example, a first order infinite impulse response (IIR) filter with smoothing constant 'a' having a value of approximately 0.5 may be used. Other types of filters and smoothing constant values may also be used. As another example, a finite impulse response (FIR) filter, such as a 10 tap moving average filter, may also be used.

The attenuation determiner 110 may further determine whether to attenuate the input audio signal 120 based on a level of the input audio signal 120, as well as the voltage level of the battery 130. The attenuation determiner 110 may determine the level of the input audio signal 120 as described above, and may compare the level of the input audio signal 120 to an audio signal level threshold 114. The attenuation determiner 110 may then determine to attenuate the input audio signal 120 if the level of the input audio signal 120 is above the audio signal level threshold 114. The threshold 114 may be set by a user or an administrator, for example.

In some implementations, the attenuation determiner 110 may determine whether to attenuate the input audio signal 120 only if the battery voltage level is below the voltage threshold 113, regardless of the level of the input audio signal 120. In these implementations, the attenuation determiner 110 may only determine the level of the input audio signal 120 if the battery voltage level is below the voltage threshold 113. In other implementations, the attenuation determiner 110 may determine whether to attenuate the input audio signal 120 only if the input audio signal level is above the audio signal level threshold 114, regardless of the battery voltage level. In these implementations, the attenuation determiner 110 may only determine the battery voltage level if the level of the input audio signal 120 is above the audio signal level threshold 114.

In some implementations, the attenuation determiner 110 may receive a far-field speaker enabled signal 101, and may determine whether to attenuate the input audio signal 120 based on the signal 101. The far-field speaker enabled signal 101 may be received from a processor or component associated with the mobile station and may indicate whether or not the far-field speaker 190 has been enabled. Accordingly, if the far-field speaker 190 is not enabled, then the attenuation determiner 110 may not determine to attenuate the input audio signal 120. In such implementations, if the far-field speaker 190 is not enabled, then the attenuation determiner 110 may not determine either of the battery voltage level or the input audio signal level.

After determining to attenuate the input audio signal 120, the attenuation determiner 110 may determine a target amount of attenuation to apply to the input audio signal 120. The attenuation determiner 110 may determine the target attenuation to apply based on the battery voltage level of the battery 130 and a target attenuation mapping 111. In some implementations, the mapping 111 may comprise a table or other data structure that indicates the target attenuation to apply for a given battery voltage level. In other implementations, the target attenuation mapping 111 may comprise a factor or other value that may be multiplied by the battery voltage level (or otherwise applied to the battery voltage level) to determine the target attenuation. Where there are multiple target attenuation mappings, the input audio level 120 may be used to select the target attenuation mapping to use.

The attenuation determiner 110 may further determine the target attenuation according to a maximum attenuation 112. The maximum attenuation 112 may be set by a user or an administrator, for example, and may be a maximum amount of attenuation that may be applied to the input audio signal 120. If the target attenuation determined by the attenuation determiner 110 using the target attenuation mapping is above the maximum attenuation 112, then the attenuation determiner 110 may set the target attenuation to the maximum attenuation 112.

Figure 2:
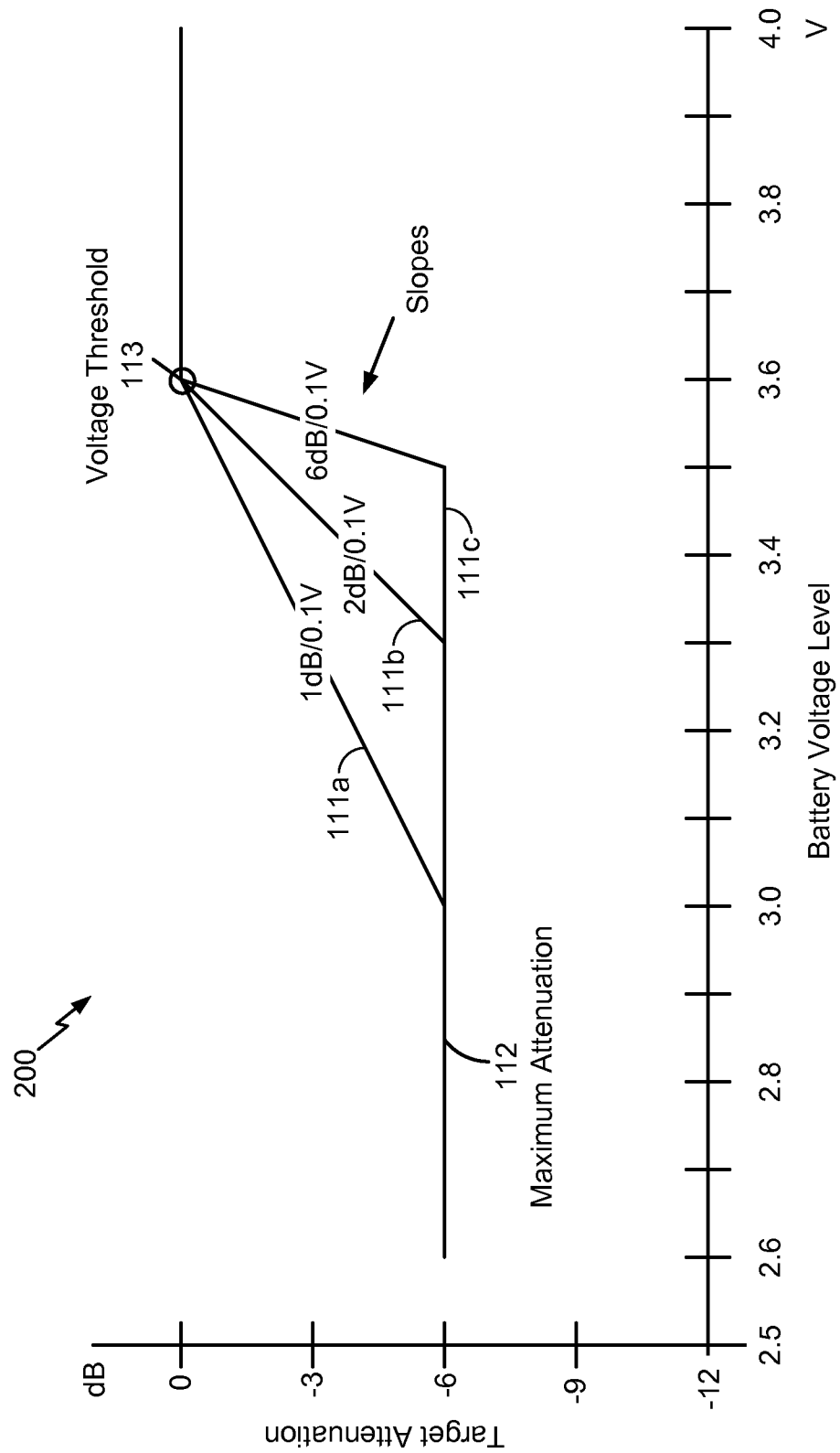
FIG. 2 is a graph illustrating an example target attenuation and battery voltage level.

For example, FIG. 2 is a graph 200 illustrating example target attenuations determined by the attenuation determiner 110. The y-axis of the graph 200 shows target attenuation, and the x-axis of the graph 300 shows battery voltage level. The graph 200 shows three different target attenuation mappings 111a, 111b, and 111c. Each target attenuation mapping 111a-c is associated with a different attenuation rate, reflected by the slopes of lines of mappings 111a-c, respectively. For the target attenuation mapping 111a, the input audio signal 120 is attenuated by 1 db for every 0.1 V drop in battery voltage level. For the target attenuation mapping 111b, the input audio signal 120 is attenuated by 2 db for every 0.1 V drop in battery voltage level. For the target attenuation mapping 111c, the input audio signal 120 is attenuated by 6 db for every 0.1 V drop in battery voltage level.

As illustrated, the input audio signal 120 is only attenuated when the voltage drops below the voltage threshold 113 of 3.6 volts. This voltage threshold 113 acts as a trip point. In addition, in this example, the target attenuation is never greater than the maximum attenuation 112 of −6 db. Note that the input audio signal 120 is negatively attenuated to reduce the volume of the input audio signal 120, thus an attenuation of −12 db represents a greater amount of attenuation than −1 db, for example.

In an implementation, given the slope and the trip point values, the amount of attenuation to apply can be determined as: (trip point−battery voltage level)×slope (not to be exceeded by the maximum attenuation). The maximum attenuation 112 provides the attenuation determiner 110 with an upper limit of attenuation to apply. For example, if the trip point is 3.6 V and the slope is 2 dB/0.1 V, the amount of attenuation that is applied to the signal if the battery voltage level is at 3.4V (assuming the signal level threshold has been exceeded) is: 3.6−3.4=0.2 V; 0.2 V×2 dB/0.1 V=4 dB.

The maximum attenuation 112 provides the attenuation determiner 110 with an upper limit of attenuation to apply. The value of the maximum attenuation 112 is programmable, in an implementation.

The gain engine 115 receives the target attenuation from the attenuation determiner 110 and applies the target attenuation to the input audio signal 120. In some implementations the gain engine 115 may apply the target attenuation by configuring the amplifier 170. Alternatively, or additionally, the gain engine 115 may apply the target attenuation by writing new gain values into an audio power amplifier associated with a codec being implemented by the environment 100.

In some implementations, the gain engine 115 may apply the target attenuation in the digital domain, prior to the amplifier 170 or the speaker driver 180. For example, the gain engine 115 may configure the digital gain controller 145 to apply the gain digitally to the input audio signal 120, rather than the amplifier 170. The digital gain controller 145 may be implemented using a variety of well known techniques.

In some implementations, rather than immediately apply the target attenuation to the input audio signal 120, the gain engine 115 may gradually apply the target attenuation to the input audio signal 120 over time. The rate at which the gain engine 115 may apply the target attenuation is known as a step rate 118, and may be set by a user or an administrator, for example. An example step rate 118 may be 10 μs/0.5 db, meaning that the attenuation may be applied to the input audio signal 120 at a rate of 0.5 db every 10 μs until the target attenuation is reached.

In some implementations, the step rate 118 used by the gain engine 115 may be the same whether or not a current attenuation is raised or lowered to reach the target attenuation. In other implementations, a different step rate 118 may be used depending on whether the attenuation is raised or lowered by the gain engine 115.

More particularly, in an implementation, the gain engine 115 takes the information from the attenuation determiner 110 and writes the new gain values into the codec's audio power amplifier or into the digital gain controller 145 to digital to analog conversion. The gain is not updated instantaneously, but by specific attack and release times. Both the attack and release times may be programmable values. The attack time refers to how quickly the gain should be stepped down from one target value to the next. For example, a typical value may be 10 μs/0.5 dB. This means that the gain should be lowered by 0.5 dB every 10 μs until the new target attenuation is reached. The release time refers to how quickly the gain should be stepped up from one target value to the next. For example, a typical value may be 800 ms/0.5 dB. This means that the gain should be raised by 0.5 dB every 800 ms until the new target attenuation is reached. The attack time is applied when going lower in gain and the release time is applied when going higher in gain. It is noted that a new target attenuation could come in before the prior target attenuation has been reached. In such a case, the gain engine 115 may keep track of its current gain setting and its target.

In some implementations, rather than determine whether to attenuate the input audio signal 120 as described above, the attenuation determiner 110 may determine whether to attenuate the input audio signal 120 using what is referred to herein as a limiter based approach. In the limiter based approach, the attenuation determiner 110 may determine if the input audio signal 120 level is greater than the audio signal level threshold 114, and if not, may determine not to attenuate the input audio signal 120 and may further determine to instruct the gain engine 115 to reduce the amount of attenuation currently applied to the input audio signal 120 (if any).

If the input audio signal 120 level is greater than the audio signal level threshold 114, the attenuation determiner 110 may calculate a limit threshold for the input audio signal 120 based on the voltage level of the battery 130 as determined by the voltage level determiner 107. In addition, the limit threshold may further be calculated based on the voltage threshold 113 (i.e., trip point) and the target attenuation mapping 111 (i.e., slope). In some implementations, the limit threshold may be determined by multiplying the difference between the battery voltage level and the trip point by the slope.

The attenuation determiner 110 may then determine if the level of the input audio signal 120 (including any attenuation or gain currently applied) is greater than the calculated limit threshold. If the level is greater than the limit threshold, then the attenuation determiner 110 may instruct the gain engine 115 to increase the amount of attenuation applied to the input audio signal 120. Otherwise, the attenuation determiner 110 may instruct the gain engine 115 to decrease the amount of attenuation applied to the input audio signal 120.

Figure 3:
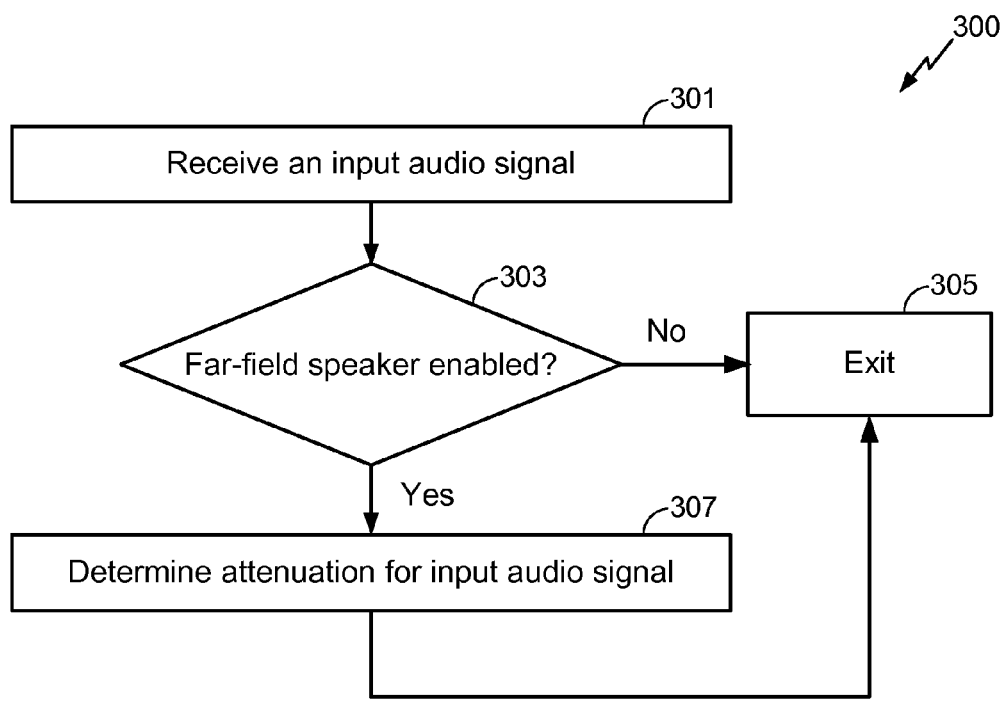
FIG. 3 is an operational flow of an implementation of a method for determining whether to attenuate an input audio signal.

FIG. 3 is an operational flow of an implementation of a method 300 for determining whether to attenuate an input audio signal. The method may be implemented by the attenuation determiner 110 of the control path 150. An input audio signal is received at 301. The input audio signal 120 may be received by the attenuation determiner 110 of the control path 150. The input audio signal 120 may be a digital audio signal and may be received from a processor or other component of a mobile station.

A determination is made as to whether the far-field speaker is enabled at 303. The determination may be made by the attenuation determiner 110 of the control path 150 based on the far-field speaker enabled signal 101. If the far-field speaker 190 is not enabled, then the method 300 may exit at 305. Otherwise, the method 300 may continue at 307 where an amount of attenuation for the input audio signal 120 may be determined by the attenuation determiner 110.

Figure 4:
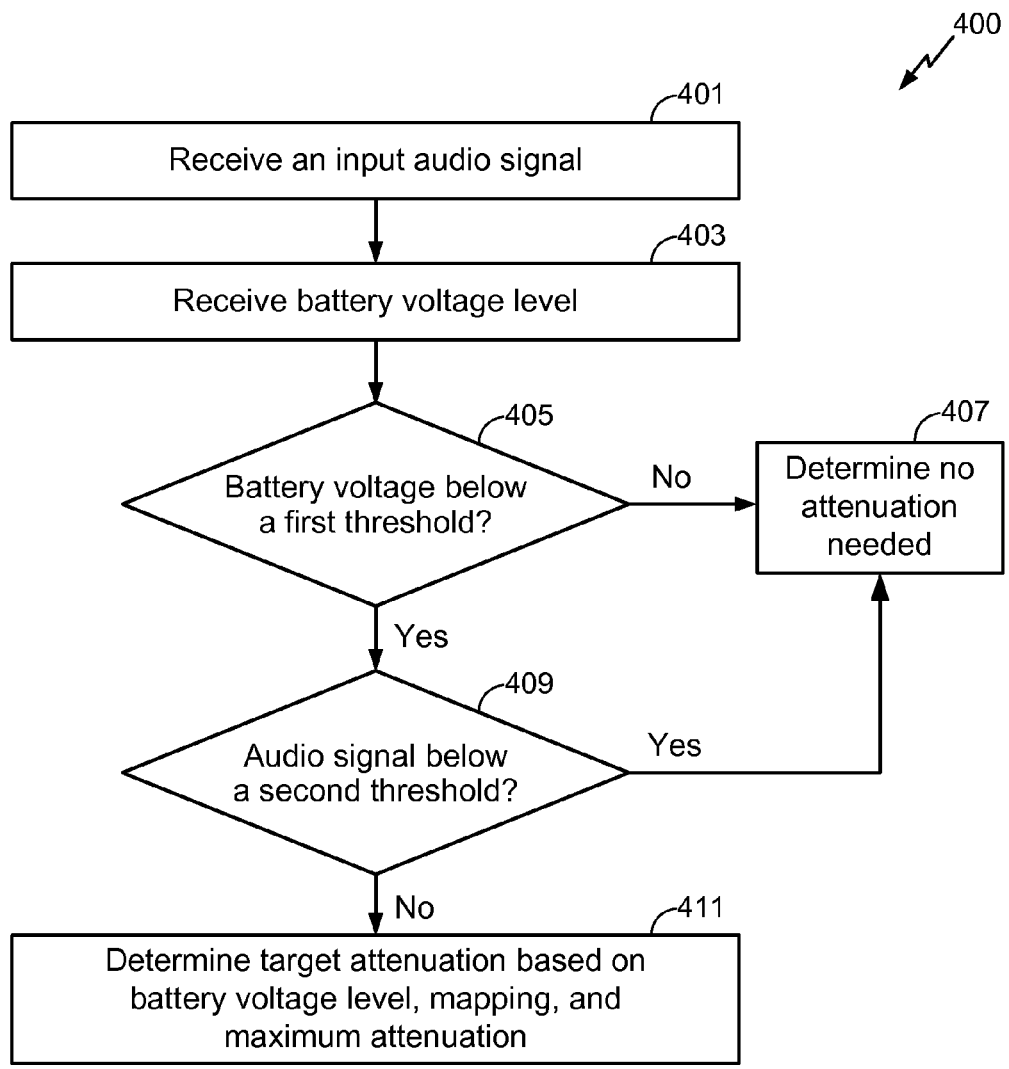
FIG. 4 is an operational flow of another implementation of a method for determining whether to attenuate an input audio signal.

FIG. 4 is an operational flow of another implementation of a method 400 for determining whether to attenuate an input audio signal. The method 400 may be implemented by the attenuation determiner 110 of the control path 150. An input audio signal is received at 401. The input audio signal 120 may be received by the attenuation determiner 110 from the delay generator 105.

A battery voltage level may be received at 403. The battery voltage level may be received by the attenuation determiner 110 from the voltage level determiner 107. The battery voltage level may be a measure of the available voltage of the battery 130 of a mobile station.

A determination is made as to whether the battery voltage level is less than a first threshold at 405. The determination may be made by the attenuation determiner 110. The first threshold may be the voltage threshold 113, and may be set by a user or an administrator, for example. If the battery voltage level is above the first threshold, then there is no risk of a reset or brown out due to the audio signal and the method 400 may determine no attenuation is needed at 407. Otherwise, if the battery voltage is below the first threshold, then the method 400 may continue at 409.

A determination is made as to whether the input audio signal is below a second threshold at 409. The determination may be made by the attenuation determiner 110. The second threshold may be the audio signal level threshold 114, and may also be set by a user or an administrator. If the input audio signal is below the second threshold, then there is similarly no risk of a system reset or brown out, and the method 400 may determine that no attenuation is needed at 407. Otherwise, processing may continue at 411 where a target attenuation is determined.

A target attenuation is determined at 411. The target attenuation may be determined by the attenuation determiner 110 using the battery voltage level, target attenuation mapping 111, and a maximum attenuation 112, for example. The target attenuation may then be provided to the gain engine 115 where the target attenuation may be applied to the input audio signal 120.

Figure 5:
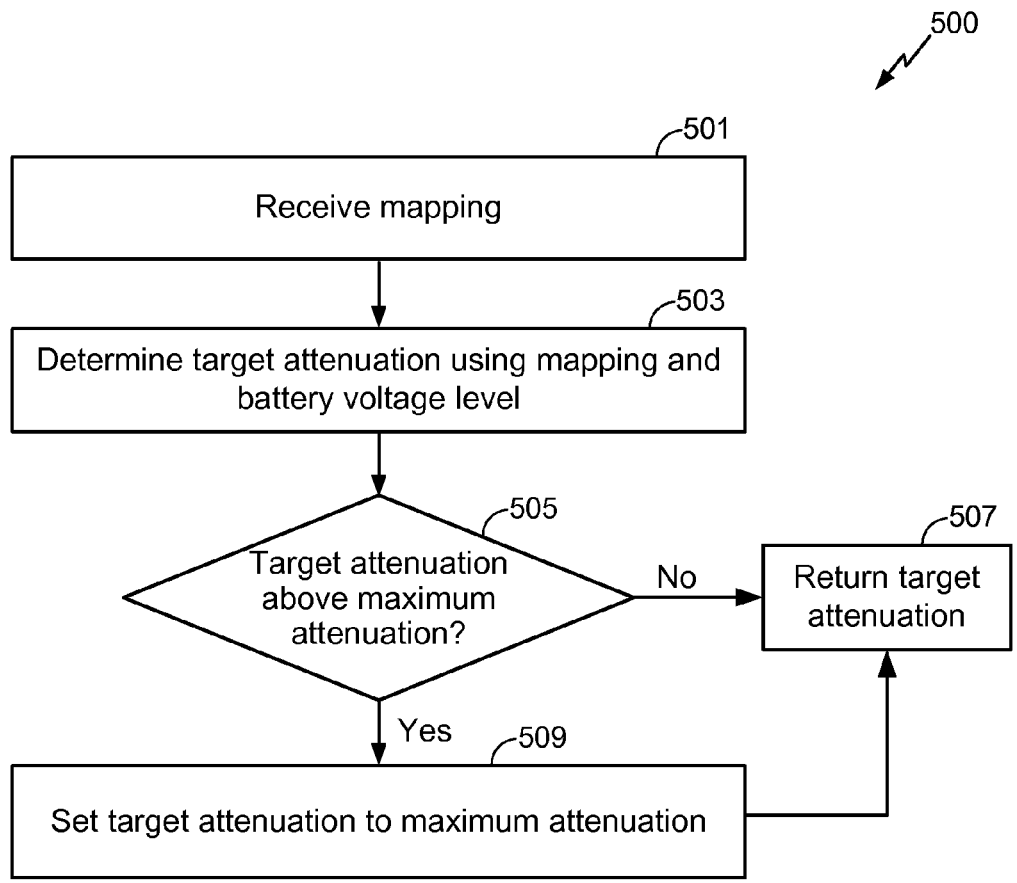
FIG. 5 is an operational flow of an implementation of a method for determining a target attenuation for an input audio signal.

FIG. 5 is an operational flow of an implementation of a method 500 for determining a target attenuation for an input audio signal. The method 500 may be implemented by the attenuation determiner 110. A mapping is received at 501. The mapping may be received by the attenuation determiner 110. The mapping may be the target attenuation mapping 111 and may comprise a mapping from battery voltage levels to target attenuations. In some implementations, the mapping may be a factor or other value that may be multiplied by the battery voltage level (or otherwise applied to the voltage level) to determine the target attenuation.

A target attenuation is determined using the mapping and the battery voltage level at 503. The target attenuation may be determined by the attenuation determiner 110. In implementations where the target attenuation mapping 111 is a value, the value may be multiplied by the battery voltage level to determine the target attenuation.

A determination is made as to whether the target attenuation is greater than a maximum attenuation at 505. The determination may be made by the attenuation determiner 110 using the maximum attenuation 112. The maximum attenuation 112 may be set by a user or an administrator and may represent the maximum attenuation that may be applied to the input audio signal 120. If the target attenuation is less than the maximum attenuation 112, then the target attenuation may be returned at 507 to be applied to attenuate the signal. Otherwise, processing may continue at 509.

The target attenuation may be set to the maximum attenuation at 509. Because the determined target attenuation was greater than the maximum attenuation 112, the attenuation determiner 110 may set the target attenuation to the maximum attenuation 110. After setting the target attenuation to the maximum attenuation 112, the method 500 may return the target attenuation at 507 to be applied to attenuate the signal.

Figure 6:
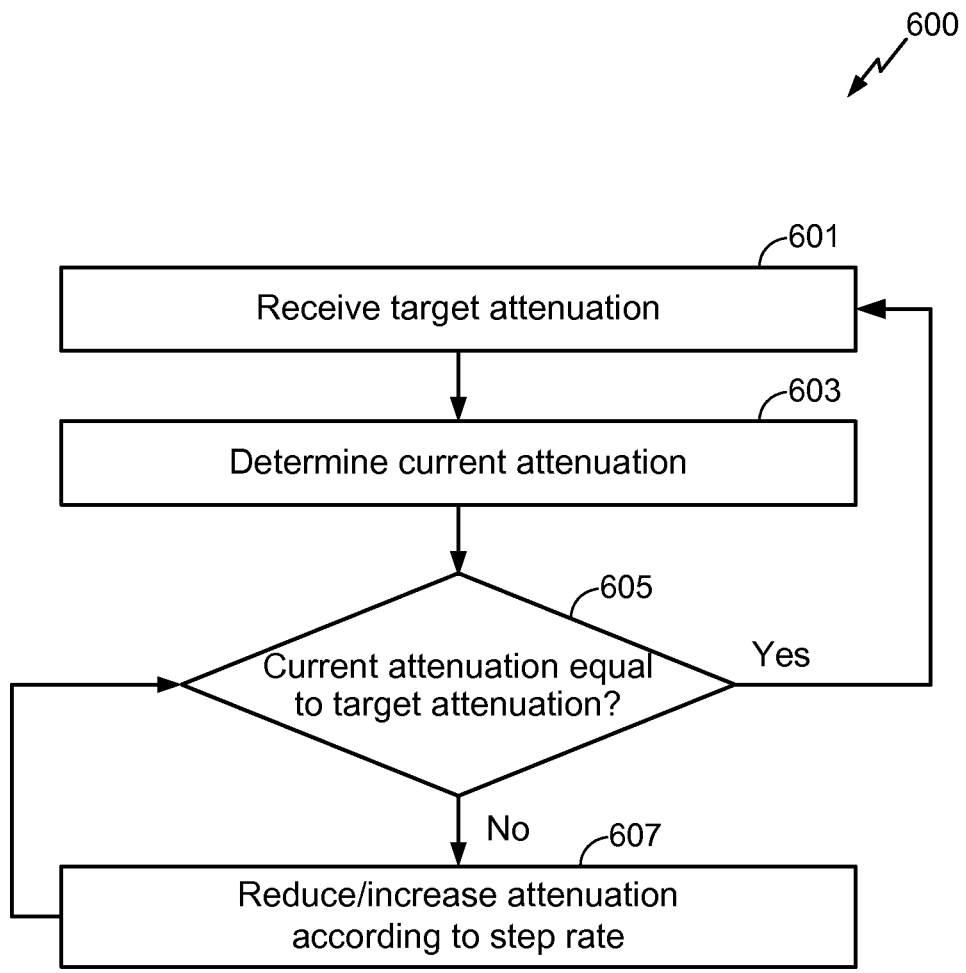
FIG. 6 is an operational flow of an implementation of a method for adjusting an attenuation applied to an input audio signal.

FIG. 6 is an operational flow of an implementation of a method 600 for adjusting an attenuation applied to an input audio signal. The method 600 may be implemented by the gain engine 115 of the control path 150. A target attenuation is received at 601. The target attenuation may have been determined by the attenuation determiner 110 and received by the gain engine 115.

A current attenuation is determined at 603. The current attenuation may be determined by the gain engine 115 and may be the attenuation that is being applied to the input audio signal 120 by the amplifier 170 or somewhere in the digital signal path.

A determination is made as to whether the current attenuation is equal to the target attenuation at 605. The determination may be made by the gain engine 115. If the current attenuation is equal to the target attenuation, then the method 600 may continue to 601 to receive a new target attenuation amount. Otherwise, processing may continue at 607.

The current attenuation is reduced or increased according to a step rate at 607. The current attenuation may be increased or reduced by the gain engine 115 through the amplifier 170 or the digital gain controller 145. The increase or reduction may be made according to the step rate 118 and may be set by a user or an administrator, for example. In some implementations, a separate step rate 118 may be used depending on whether the current attenuation is increased or decreased. After changing the current attenuation, the method 600 may return to 605 to determine if the current attenuation is equal to the target attenuation.

Figure 7:
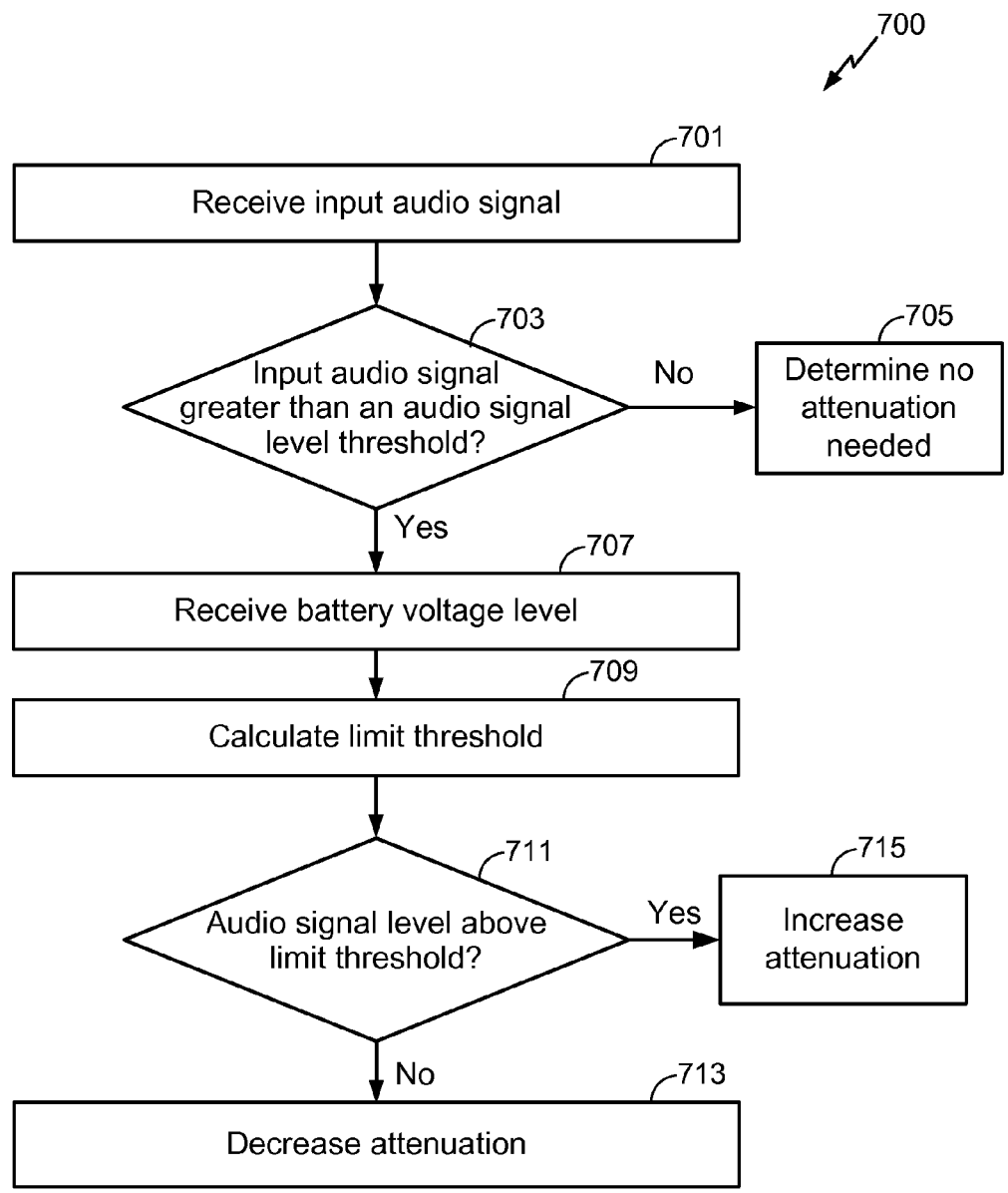
FIG. 7 is an operational flow of an implementation of another method for adjusting an attenuation applied to an input audio signal.

FIG. 7 is an operational flow of an implementation of a method 700 for determining whether to increase or decrease an amount of attenuation applied to an input audio signal. The method 700 is an example of the limiter based approach for adjusting attenuation. The method 700 may be implemented by the attenuation determiner 110 of the control path 150. An input audio signal is received at 701. The input audio signal 120 may be received by the attenuation determiner 110 from the delay generator 105.

A determination is made as to whether a level of the input audio signal is greater than a threshold audio level at 703. The determination may be made by the attenuation determiner 110 using the audio signal level threshold 114. If the level of the input audio signal is greater than the threshold audio level, then the method 700 may continue at 707. Otherwise, the method 700 may determine that no attenuation is needed at 705.

A battery voltage level is received at 707. The battery voltage level may be received by the attenuation determiner 110 from the voltage level determiner 107. The battery voltage level may be a measure of the available voltage of the battery 130 of a mobile station.

A limit threshold is calculated at 709. The limit threshold may be calculated by the attenuation determiner 110 using the battery voltage level. In some implementations, the limit threshold may be calculated by the attenuation determiner 110 using the received battery voltage level, the target attenuation mapping 111, and the voltage threshold 113.

A determination is made as to whether the level of the input audio signal is above the limit threshold at 711. The determination may be made by the attenuation determiner 110 using the calculated limit threshold. If the level of the input audio signal is above the limit threshold, then the method 700 may increase the applied attenuation at 715. Otherwise, the method 700 may decrease the applied attenuation at 717.

As used herein, the term "determining" (and grammatical variants thereof) is used in an extremely broad sense. The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa).

Figure 8:
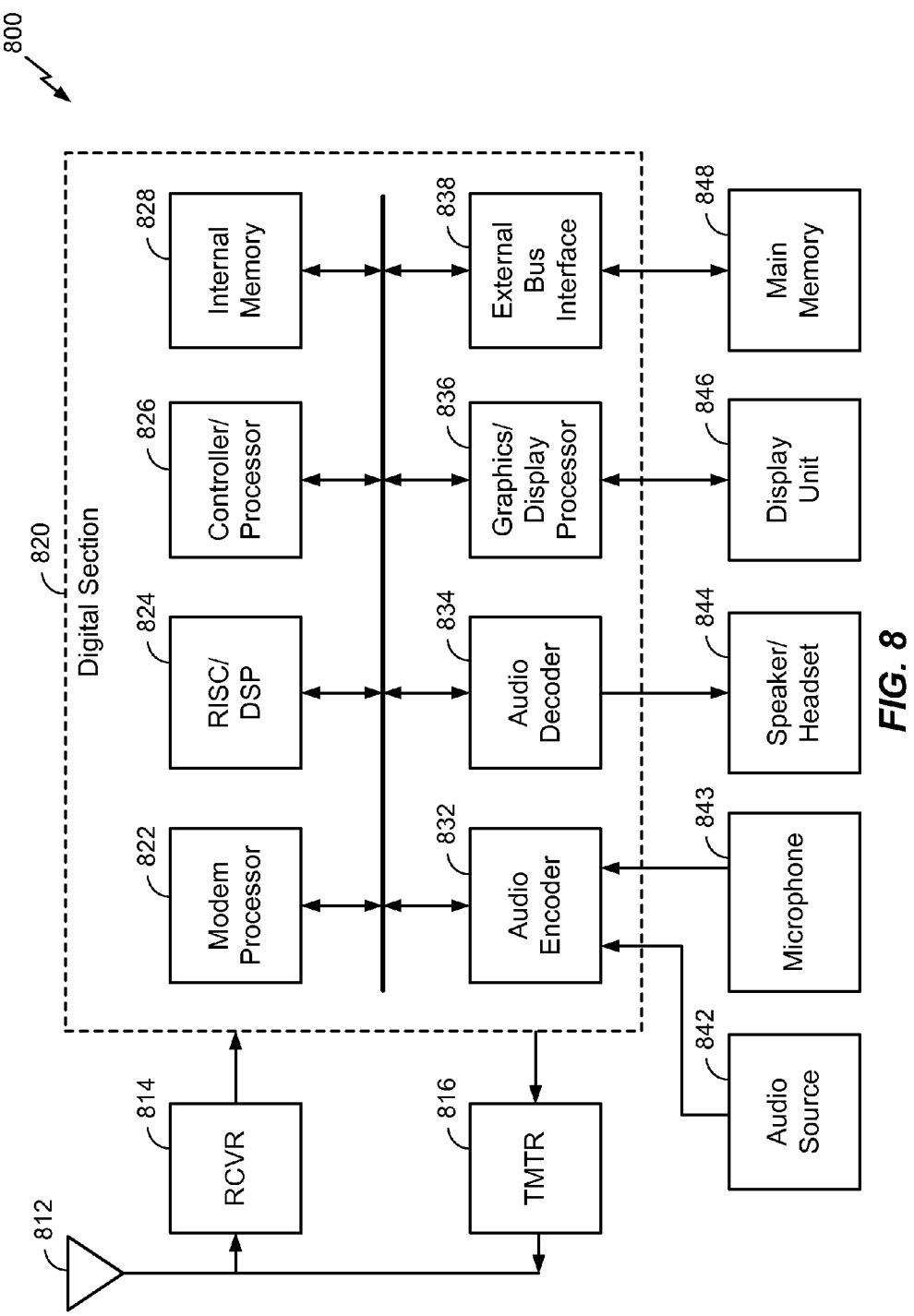
FIG. 8 is a diagram of an example mobile station.

FIG. 8 shows a block diagram of a design of an example mobile station 800 in a wireless communication system. Mobile station 800 may be a cellular phone, a terminal, a handset, a PDA, a wireless modem, a cordless phone, etc. The wireless communication system may be a CDMA system, a GSM system, etc.

Mobile station 800 is capable of providing bidirectional communication via a receive path and a transmit path. On the receive path, signals transmitted by base stations are received by an antenna 812 and provided to a receiver (RCVR) 814. Receiver 814 conditions and digitizes the received signal and provides samples to a digital section 820 for further processing. On the transmit path, a transmitter (TMTR) 816 receives data to be transmitted from digital section 820, processes and conditions the data, and generates a modulated signal, which is transmitted via antenna 812 to the base stations. Receiver 814 and transmitter 816 may be part of a transceiver that may support CDMA, GSM, etc.

Digital section 820 includes various processing, interface, and memory units such as, for example, a modem processor 822, a reduced instruction set computer/digital signal processor (RISC/DSP) 824, a controller/processor 826, an internal memory 828, a generalized audio encoder 832, a generalized audio decoder 834, a graphics/display processor 836, and an external bus interface (EBI) 738. Modem processor 822 may perform processing for data transmission and reception, e.g., encoding, modulation, demodulation, and decoding. RISC/DSP 824 may perform general and specialized processing for wireless device 800. Controller/processor 826 may direct the operation of various processing and interface units within digital section 820. Internal memory 828 may store data and/or instructions for various units within digital section 820.

Generalized audio encoder 832 may perform encoding for input signals from an audio source 842, a microphone 843, etc. Generalized audio decoder 834 may perform decoding for coded audio data and may provide output signals to a speaker/headset 844. Graphics/display processor 836 may perform processing for graphics, videos, images, and texts, which may be presented to a display unit 846. EBI 838 may facilitate transfer of data between digital section 820 and a main memory 848.

Digital section 820 may be implemented with one or more processors, DSPs, microprocessors, RISCs, etc. Digital section 820 may also be fabricated on one or more application specific integrated circuits (ASICs) and/or some other type of integrated circuits (ICs).

Figure 9:
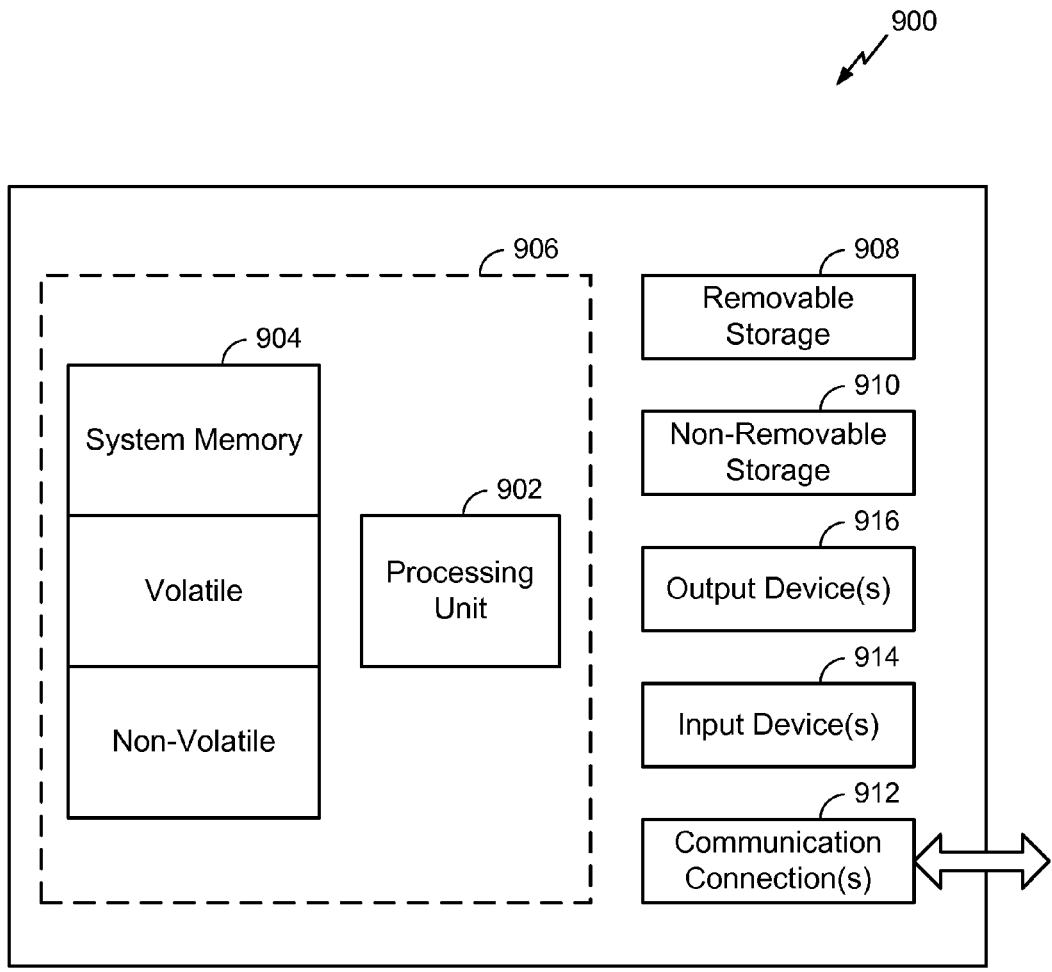
FIG. 9 shows an exemplary computing environment.

FIG. 9 shows an exemplary computing environment in which example implementations and aspects may be implemented. The computing system environment is only one example of a suitable computing environment and is not intended to suggest any limitation as to the scope of use or functionality.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 9, an exemplary system for implementing aspects described herein includes a computing device, such as computing device 900. In its most basic configuration, computing device 900 typically includes at least one processing unit 902 and memory 904. Depending on the exact configuration and type of computing device, memory 904 may be volatile (such as random access memory (RAM)), non-volatile (such as read-only memory (ROM), flash memory, etc.), or some combination of the two. This most basic configuration is illustrated in FIG. 9 by dashed line 906.

Computing device 900 may have additional features and/or functionality. For example, computing device 900 may include additional storage (removable and/or non-removable) including, but not limited to, magnetic or optical disks or tape. Such additional storage is illustrated in FIG. 9 by removable storage 908 and non-removable storage 910.

Computing device 900 typically includes a variety of computer-readable media. Computer-readable media can be any available media that can be accessed by device 900 and include both volatile and non-volatile media, and removable and non-removable media. Computer storage media include volatile and non-volatile, and removable and non-removable media implemented in any method or technology for storage of information such as computer readable instructions, data structures, program modules or other data. Memory 904, removable storage 908, and non-removable storage 910 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 900. Any such computer storage media may be part of computing device 900.

Computing device 900 may contain communications connection(s) 912 that allow the device to communicate with other devices. Computing device 900 may also have input device(s) 914 such as a keyboard, mouse, pen, voice input device, touch input device, etc. Output device(s) 916 such as a display, speakers, printer, etc. may also be included. All these devices are well known in the art and need not be discussed at length here.

In general, any device described herein may represent various types of devices, such as a wireless or wired phone, a cellular phone, a laptop computer, a wireless multimedia device, a wireless communication PC card, a PDA, an external or internal modem, a device that communicates through a wireless or wired channel, etc. A device may have various names, such as access terminal (AT), access unit, subscriber unit, mobile station, mobile device, mobile unit, mobile phone, mobile, remote station, remote terminal, remote unit, user device, user equipment, handheld device, non-mobile station, non-mobile device, endpoint, etc. Any device described herein may have a memory for storing instructions and data, as well as hardware, software, firmware, or combinations thereof.

The attenuation techniques described herein may be implemented by various means. For example, these techniques may be implemented in hardware, firmware, software, or a combination thereof. Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

For a hardware implementation, the processing units used to perform the techniques may be implemented within one or more ASICs, DSPs, digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof.

Thus, the various illustrative logical blocks, modules, and circuits described in connection with the disclosure herein may be implemented or performed with a general-purpose processor, a DSP, an ASIC, a FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

For a firmware and/or software implementation, the techniques may be embodied as instructions on a computer-readable medium, such as random access RAM, ROM, non-volatile RAM, programmable ROM, EEPROM, flash memory, compact disc (CD), magnetic or optical data storage device, or the like. The instructions may be executable by one or more processors and may cause the processor(s) to perform certain aspects of the functionality described herein.

If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes CD, laser disc, optical disc, digital versatile disc (DVD), floppy disk and blu-ray disc where disks usually reproduce data magnetically, while discs reproduce data optically with lasers. Combinations of the above should also be included within the scope of computer-readable media.

A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include PCs, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for attenuating audio signals in a mobile device, comprising:
   determining a battery voltage level of a battery of the mobile device;
   determining an audio signal level of an audio signal, wherein determining the audio signal level is performed if the battery voltage level is below a first threshold;
   comparing the audio signal level to a threshold;
   determining whether to attenuate the audio signal based on the battery voltage level and based upon the comparison; and
   selecting, from a plurality of different attenuation rates, an attenuation rate to apply to the audio signal based on the determined battery voltage level, wherein a change in the audio signal level is associated with a change in the battery voltage level.

2. The method of claim 1, wherein attenuating the audio signal based on the battery voltage level and the audio signal level comprises attenuating the audio signal if the battery voltage level is below the first threshold, and if the audio signal level is above a second threshold.

3. The method of claim 2, wherein determining the battery voltage level is performed if the audio signal level is above the second threshold.

4. The method of claim 2, wherein the audio signal is not attenuated if the battery voltage level is above the first threshold, or if the audio signal level is below the second threshold.

5. The method of claim 1, further comprising determining a target attenuation of the audio signal based on the battery voltage level, a mapping of battery voltage levels to target attenuations, and a maximum attenuation.

6. The method of claim 5, further comprising determining an attenuation increase based on the target attenuation and a current attenuation.

7. The method of claim 6, further comprising determining the attenuation increase based on a step rate.

8. The method of claim 1, further comprising receiving the audio signal at the mobile device.

9. The method of claim 1, wherein attenuating the audio signal prevents a brown out of the battery voltage or a reset of the mobile device.

10. The method of claim 1, wherein determining the battery voltage level is only performed if a far-field speaker is in use.

11. The method of claim 1, wherein attenuating the audio signal based on the battery voltage level and the audio signal level comprises:
    calculating a limit threshold based on the battery voltage level;
    determining an attenuation increase if the audio signal level is above the limit threshold; and
    determining an attenuation decrease if the audio signal level is not above the limit threshold.

12. The method of claim 11, wherein calculating the limit threshold further comprises calculating the limit threshold based on the battery voltage level, a mapping of battery voltage levels to target attenuations, and a threshold battery voltage level.

13. An apparatus for attenuating audio signals in a mobile device, comprising:
    means for determining a battery voltage level of a battery of the mobile device;
    means for determining an audio signal level of an audio signal, wherein the means for determining the audio signal level performs if the battery voltage level is below a first threshold;
    means for comparing the audio signal level to a threshold;
    means for determining whether to attenuate the audio signal based on the battery voltage level and based upon the comparison; and
    means for selecting, from a plurality of different attenuation rates, an attenuation rate to apply to the audio signal based on the determined battery voltage level, wherein a change in the audio signal level is associated with a change in the battery voltage level.

14. The apparatus of claim 13, wherein the means for attenuating the audio signal based on the battery voltage level and the audio signal level attenuates the audio signal if the battery voltage level is below the first threshold, and if the audio signal level is above a second threshold.

15. The apparatus of claim 14, wherein the means for determining the battery voltage level determines the battery voltage level if the audio signal level is above the second threshold.

16. The apparatus of claim 14, wherein the means for attenuating the audio signal only attenuates the audio signal if the battery voltage level is above the first threshold, or if the audio signal level is below the second threshold.

17. The apparatus of claim 13, further comprising means for determining a target attenuation of the audio signal based on the battery voltage level, a mapping of battery voltage levels to target attenuations, and a maximum attenuation.

18. The apparatus of claim 17, further comprising means for determining an attenuation increase based on the target attenuation and a current attenuation.

19. The apparatus of claim 18, wherein the means for determining the attenuation increase determines the attenuation increase based on a step rate.

20. The apparatus of claim 13, further comprising means for receiving the audio signal at the mobile device.

21. The apparatus of claim 13, wherein the means for attenuating the audio signal prevents a brown out of the battery voltage or a reset of the mobile device.

22. The apparatus of claim 13, wherein the means for determining the battery voltage level only determines the battery voltage if a far-field speaker is in use.

23. The apparatus of claim 13, wherein the means for attenuating the audio signal based on the battery voltage level and the audio signal level comprises:
   means for calculating a limit threshold based on the battery voltage level;
   means for determining an attenuation increase if the audio signal level is above the limit threshold; and
   means for determining an attenuation decrease if the audio signal level is not above the limit threshold.

24. The apparatus of claim 23, wherein the means for calculating the limit threshold calculates the limit threshold based on the battery voltage level, a mapping of battery voltage levels to target attenuations, and a threshold battery voltage level.

25. A non-transitory computer-readable medium comprising instructions that cause a computer to:
   determine a battery voltage level of a battery of the computer;
   determine an audio signal level of an audio signal, wherein determining the audio signal level is performed if the battery voltage level is below a first threshold;
   compare the audio signal level to a threshold;
   determine whether to attenuate the audio signal based on the battery voltage level and based upon the comparison; and
   select, from a plurality of different attenuation rates, an attenuation rate to apply to the audio signal based on the determined battery voltage level, wherein a change in the audio signal level is associated with a change in the battery voltage level.

26. The computer-readable medium of claim 25, wherein attenuating the audio signal based on the battery voltage level and the audio signal level comprises attenuating the audio signal if the battery voltage level is below the first threshold, and if the audio signal level is above a second threshold.

27. The computer-readable medium of claim 26, wherein determining the battery voltage level is performed if the audio signal level is above the second threshold.

28. The computer-readable medium of claim 26, wherein the audio signal is not attenuated if the battery voltage level is above the first threshold, or if the audio signal level is below the second threshold.

29. The computer-readable medium of claim 25, further comprising instructions that cause the computer to determine a target attenuation of the audio signal based on the battery voltage level, a mapping of battery voltage levels to target attenuations, and a maximum attenuation.

30. The computer-readable medium of claim 29, further comprising instructions that cause the computer to determine an attenuation increase based on the target attenuation and a current attenuation.

31. The computer-readable medium of claim 30, further comprising instructions that cause the computer to determine the attenuation increase based on a step rate.

32. The computer-readable medium of claim 25, further comprising instructions that cause the computer to receive the audio signal at the computer.

33. The computer-readable medium of claim 25, wherein attenuating the audio signal prevents a brown out of the battery voltage or a reset of the computer.

34. The computer-readable medium of claim 25, wherein determining the battery voltage level is only performed if a far-field speaker is in use.

35. The computer-readable medium of claim 25, wherein the instructions that cause the computer to attenuate the audio signal based on the battery voltage level and the audio signal level further comprises instructions that cause the computer to:
   calculate a limit threshold based on the battery voltage level;
   determine an attenuation increase if the audio signal level is above the limit threshold; and
   determine an attenuation decrease if the audio signal level is not above the limit threshold.

36. The computer-readable medium of claim 35, wherein calculating the limit threshold further comprises calculating the limit threshold based on the battery voltage level, a mapping of battery voltage levels to target attenuations, and a threshold battery voltage level.

37. An apparatus for attenuating input audio signals, comprising:
   a voltage level determiner for determining a battery voltage level of a battery of the apparatus; and
   an attenuation determiner for:
      determining an audio signal level of an audio signal, wherein determining the audio signal level is performed if the battery voltage level is below a first threshold;
      comparing the audio signal level to a threshold;
      determining whether to attenuate the audio signal based on the battery voltage level and based upon the comparison; and
      selecting, from a plurality of different attenuation rates, an attenuation rate to apply to the audio signal based on the determined battery voltage level, wherein a change in the audio signal level is associated with a change in the battery voltage level.

38. The apparatus of claim 37, wherein attenuating the audio signal based on the battery voltage level and the audio signal level comprises attenuating the audio signal if the battery voltage level is below the first threshold, and if the audio signal level is above a second threshold.

39. The apparatus of claim 38, wherein determining the battery voltage level is performed if the audio signal level is above the second threshold.

40. The apparatus of claim 38, wherein the audio signal is not attenuated if the battery voltage level is above the first threshold, or if the audio signal level is below the second threshold.

41. The apparatus of claim 37, wherein the attenuation determiner further determines a target attenuation of the audio signal based on the battery voltage level, a mapping of battery voltage levels to target attenuations, and a maximum attenuation.

42. The apparatus of claim 41, wherein the attenuation determiner further determines an attenuation increase based on the target attenuation and a current attenuation.

43. The apparatus of claim 42, wherein the attenuation determiner further determines the attenuation increase based on a step rate.

44. The apparatus of claim 37, wherein the attenuation determiner further receives the audio signal at the apparatus.

45. The apparatus of claim 37, wherein attenuating the audio signal prevents a brown out of the battery voltage or a reset of the apparatus.

46. The apparatus of claim 37, wherein determining the battery voltage level is only performed if a far-field speaker is in use.

* * * * *